United States Patent [19]

Nojo et al.

[11] Patent Number: 5,215,593
[45] Date of Patent: Jun. 1, 1993

[54] METHOD OF INTRODUCING LIQUID INTO SMALL-DIAMETER HOLE

[75] Inventors: Shigenobu Nojo, Kawasaki; Hideho Inagawa; Tohru Ohsaka, both of Yokohama, all of Japan

[73] Assignee: Canon Kabushiki Kaisha, Tokyo, Japan

[21] Appl. No.: 691,421

[22] Filed: Apr. 25, 1991

[30] Foreign Application Priority Data

Jan. 9, 1991 [JP] Japan .................................. 3-1129

[51] Int. Cl.$^5$ .............................................. B08B 3/00
[52] U.S. Cl. ...................................... 134/22.1; 134/26; 134/30; 134/31; 134/37; 427/96; 427/98
[58] Field of Search ............... 134/11, 22.1, 22.15, 134/22.18, 21, 26, 30, 31, 37, 38; 427/97, 98, 96

[56] References Cited

U.S. PATENT DOCUMENTS

| | | | |
|---|---|---|---|
| 3,028,267 | 4/1962 | Edhofer et al. | 134/30 |
| 3,229,702 | 1/1966 | Murdoch, Jr. | 134/1 |
| 3,329,528 | 7/1967 | Aldrich et al. | 134/31 |
| 4,155,775 | 5/1979 | Alpaugh et al. | 134/26 |
| 4,486,239 | 12/1984 | du Fresne | 134/31 |
| 4,781,943 | 11/1988 | Toba et al. | 134/31 |
| 5,032,427 | 7/1991 | Kukanskis et al. | 427/97 |
| 5,045,353 | 9/1991 | Takeda et al. | 427/98 |

*Primary Examiner*—Theodore Morris
*Assistant Examiner*—Saeed T. Chaudhry
*Attorney, Agent, or Firm*—Fitzpatrick, Cella, Harper & Scinto

[57] ABSTRACT

A substrate having a small-diameter hole is taken from the air and placed in a boiling vapor and/or boiling liquid in a first treatment tank of a vessel having a boiling heater, whereupon the pressure of the air in the small-diameter hole exceeds atmospheric pressure by an amount equivalent to the partial pressure of the air in the hole. Accordingly, the air cannot remain in the hole but is instead expelled to the outside. As a result, the interior of the microhole is replaced entirely by the boiling vapor and/or boiling liquid. Next, without being brought into contact with the external air, the substrate is contacted with a non-boiling liquid inside a second treatment tank, thereby preventing external gas from flowing back into the small-diameter. The non-boiling liquid and the boiling vapor and/or boiling liquid are soluble in each other. As a result, the two are unified and introduced to the small-diameter hole in the form of a liquid.

5 Claims, 8 Drawing Sheets

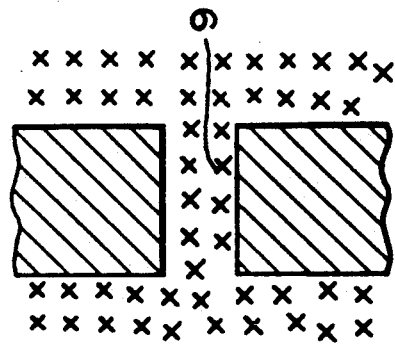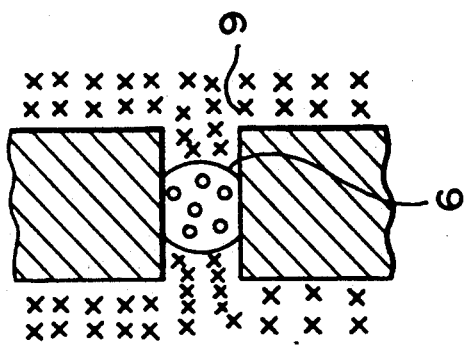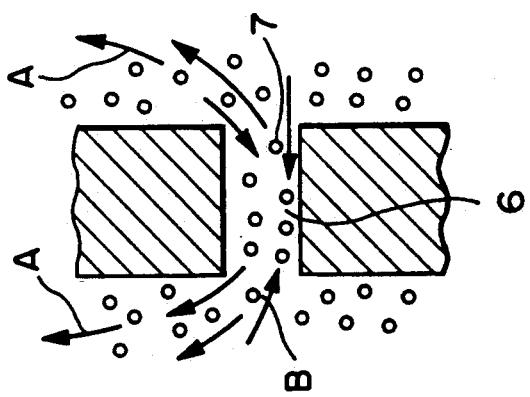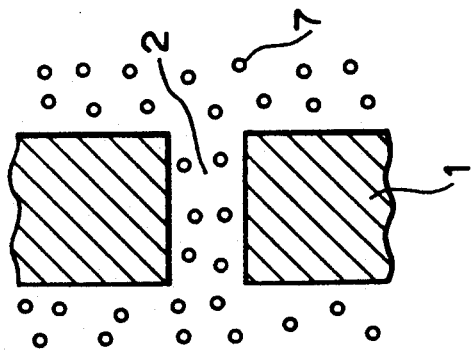

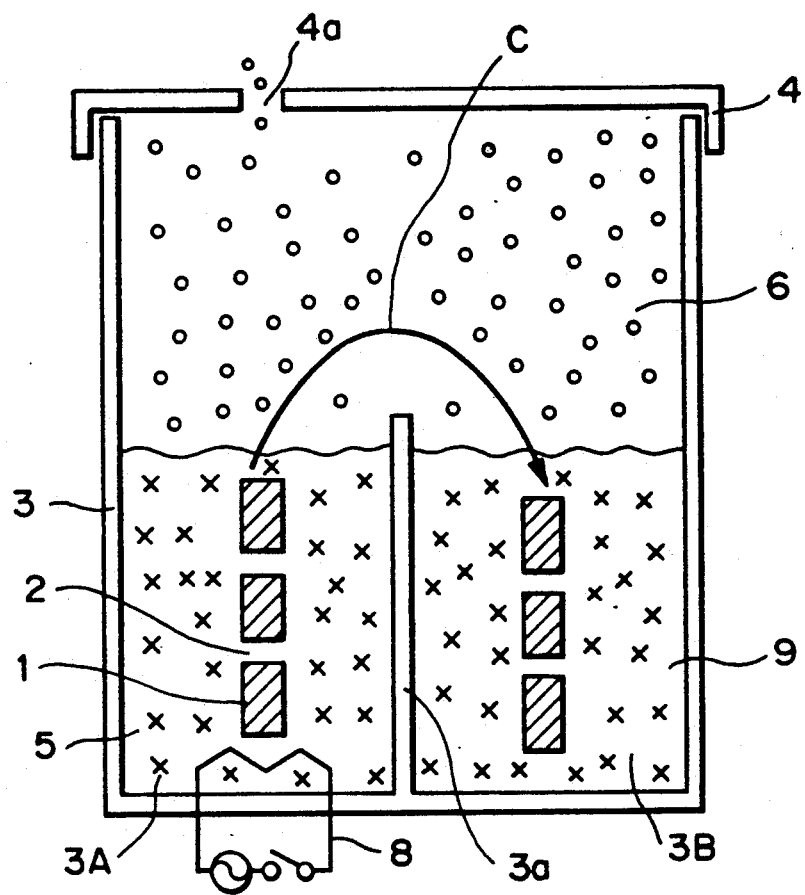
F I G. 3

METHOD OF INTRODUCING LIQUID INTO SMALL-DIAMETER HOLE

BACKGROUND OF THE INVENTION

This invention relates to a method of introducing a liquid into a hole having a small diameter, as well as to a liquid introducing apparatus which uses this method. More particularly, the invention relates to a technique for reliably introducing a liquid into a microhole formed in a substrate. By way of example, the invention can be applied effectively to the introduction of a liquid for a pretreatment when applying a plating treatment to the inner wall surface of a microhole formed in an electrically conductive film for the purpose of communicating both sides of a printed circuit board.

Ordinarily, when subjecting a substrate having a microhole to a treatment such as washing, plating or etching by a wet method using an aqueous solution, it is necessary to bring the liquid into contact with the entire surface of the substrate. However, though the liquid makes good contact with the outer surface of the substrate, it is difficult for the liquid to penetrate the interior of the microhole and to contact its inner wall surface.

FIGS. 8A and 8B are schematic sectional views for describing the conventional method of introducing liquid. When a substrate 1 having a microhole 2 is immersed in a liquid 5, as shown in FIG. 8B, after having been left standing in a gas 7 such as air (represented by the dots), as illustrated in FIG. 8A, the gas 7 remains in the microhole 2 in the form of a bubble W. As a result, portions 2a of the inner wall surface of the microhole are not contacted by the liquid 5.

For example, when a plating film is formed on the inner wall surface of the microhole 2 in the manufacture of a printed circuit board, a large number of steps using a suitable aqueous solution are carried out, such as a degreasing treatment, a catalytic treatment, an electroless plating treatment, an electroplating treatment and a water-washing treatment performed between each of these treatment steps. Consequently, when the air bubble W is left in the microhole 2, a plating film cannot be formed here and this can cause a major malfunction.

Recent printed circuit boards used in portable video cameras, personal computers and word processors are becoming increasingly smaller in size and the wiring patterns on them are becoming more dense. As a consequence, microhole diameter is gradually being reduced and a diameter on the order of 0.1 mm is now required whereas a hole diameter of 0.3 mm sufficed in the past.

A method of introducing liquid into such microholes has been proposed in Japanese Patent Application Laid-Open (KOKAI) Nos. 62-154797 and 62-190794, by way of example.

The art proposed in Japanese Patent Application Laid-Open No. 62-154797 is a method of introducing a liquid following the expulsion of air from the interior of a hole by vibrating a substrate using a vibratory degassing apparatus. Though this method is capable of readily removing air from the proximity of the openings at both ends of the hole, difficulty is encountered when it is attempted to expel the air from the central portion of the hole interior and introduce the liquid to this portion, and hence the method is beset by problems in terms of reliability.

The art proposed in Japanese Patent Application Laid-Open No. 62-190794 is a method of introducing a flux solution into a hole following elimination of air from the hole by reducing pressure in a vacuum degassing tank. This method would be highly reliable if it were capable of establishing a perfect vacuum. However, since it is required that the entire tank be hermetically sealed, the entire apparatus must have a structure which is highly rigid and which will not allow leakage of air. A problem that arises is high cost for the equipment. In a case where a gas containing moisture is drawn in using an ordinary vacuum pump, oil recirculating within the pump is broken down owing to the effects of moisture, and therefore this arrangement is not suited for use in a treatment that relies upon a liquid. In order to avoid this, common practice is to effect a reduction in pressure using a water jet pump. However, since a water jet pump exhibits but a small decompressing capability, obtaining the desired vacuum requires an extended period of time and productivity is low.

U.S. Pat. No. 4,781,943 discloses a process for pretreatment before plating through-holes of printed circuit boards. According to the process disclosed, a liquid is introduced into a hole by immersing a circuit board in vapor for about one minute, extracting it from the vapor and then immersing it, less than about 15 seconds after extraction, in running water for about one minute, the temperature of the water being less than 25° C.

However, when the circuit board is dipped into the vapor and then lifted out, the vapor is no longer capable of remaining inside the hole and the liquid cannot be introduced owing to the effect of volumetric contraction caused by a drop in the temperature of the vapor, which is a gaseous state.

Accordingly, the aforementioned U.S. Pat. No. 4,781,943 further discloses introducing a treating solution into a hole by boiling water or a treating solution that is soluble in water, immersing the substrate and then cooling the treating solution without raising the substrate out of the boiling solution.

In accordance with this proposal, however, the treating solution is boiled, the substrate is immersed and then, without extracting the substrate, the treating solution, which is in the boiling state, is cooled. The problem that arises here is low treating efficiency because the boiling and cooling cycles take time.

SUMMARY OF THE INVENTION

Accordingly, the present invention has been devised in view of the aforementioned problems encountered in the prior art and its object is to provide a method of introducing a liquid into a small-diameter hole, as well as a liquid introducing apparatus using this method, in which a liquid can be introduced to a small-diameter hole efficiently, with simple equipment, and at a high treatment capability.

As shown in FIG. 1, which shows the principle of the present invention, the liquid introducing apparatus of the invention includes a vessel 3 separated into a first treating vessel 3A, which has boiling means 8, and a second treating vessel 3B. A substrate 1 having a microhole 2 is taken from the air and placed in boiling vapor and/or boiling liquid 6 within the first treating vessel 3A. When this is done, the pressure of the air in the microhole 2 exceeds atmospheric pressure by an amount equivalent to the partial pressure of the air in the microhole, and therefore the air cannot remain in the hole but is instead expelled to the outside. As a result, the interior of the microhole 2 is replaced entirely by the boiling vapor and/or boiling liquid 6. Next, without being brought into contact with the external air, the substrate 1 is contacted with a non-boiling liquid 9 inside the second treating vessel 3B, thereby preventing external gas from flowing back into the microhole 2. The non-boiling liquid 9 and the boiling vapor and/or boiling liquid 6 are mutually soluble. As a result, the two are unified and introduced to the microhole 2 in the form of a liquid.

It goes without saying that a variety of applications are possible beyond the scope of the invention.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 2A, 2B, 2C and 2D are schematic sectional views for describing the principle of the invention;

FIG. 3 is a schematic sectional view of a second embodiment;

DESCRIPTION OF THE PREFERRED EMBODIMENTS

Preferred embodiments of the present invention will now be described in detail with reference to the drawings.

Figure 1A:
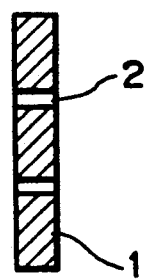
FIGS. 1A and 1B are schematic sectional views of a first embodiment of the present invention.
Figure 1B:
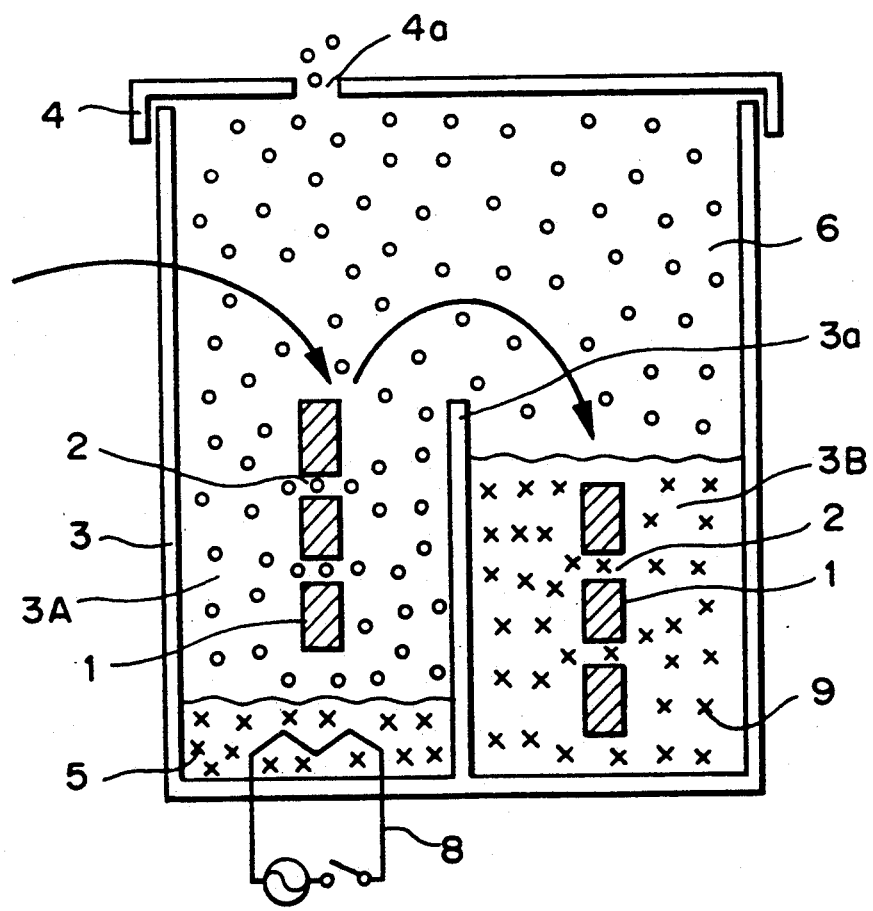

FIGS. 1A and 1B show schematic sectional views for describing a first embodiment of the present invention, in which FIG. 1A illustrates a substrate 1 in air. The substrate 1 is formed to include a microhole 2 passing completely therethrough.

FIG. 1B shows the substrate 1 placed inside a treating vessel 3 separated into two portions by a partition 3a. The left portion in FIG. 1B has a first tank 3A containing a liquid 5. The latter is heated by a heater 8 of boiling means to form a vapor which fills the first tank. The right-hand portion of the vessel 3 defines a second tank 3B into which a non-boiling liquid 9 is introduced. The vessel 3 is required to be deep enough to prevent the substrate 1 from contacting the air when the substrate is transferred from the first tank to the second tank.

The vessel 3 is covered by a lid 4 having an opening 4a. The lid 4 effectively suppresses the inflow of air from the outside. However, if the boiling capability of the vessel 3 is sufficient, the lid 4 can be dispensed with since the vapor will fill the vessel 3 to its upper end.

Examples of the boiling means are an electric heater, steam or a heating material. Further, the boiling means need not necessarily be disposed inside the vessel 3 but can be provided on the exterior of the vessel if so desired. What is required is that the boiling means be capable of maintaining a boiling state within the vessel 3.

Within the vapor 6, the vapor pressure is equal to atmospheric pressure, and therefore the pressure of the air inside the microhole 2 exceeds atmospheric pressure by an amount equivalent to the partial pressure of the air inside the hole. Accordingly, air cannot remain within the hole but is instead expelled to the outside of the hole and thence to the exterior of the vessel 3. As a result, the interior of the microhole 2 is replaced entirely by the vapor 6 produced by boiling.

Next, the substrate 1, whose hole has had its interior air expelled and replaced by the vapor 6 in the manner described above, is immersed in the non-boiling liquid 9 without being taken out of the vessel 3. As a result, the microhole 2 is brought into contact with the non-boiling liquid 9 inside the second tank 3B. The non-boiling liquid 9 is not boiling and the vapor 6 is soluble with respect thereto.

Thus, the vapor 6 inside the microhole 2 is completely liquified and dissolves in the liquid 9. As a result, the interior of the microhole 2 can be filled completely with the liquid 9.

FIG. 2 schematically illustrates the foregoing process. FIG. 2A illustrates the substrate 1 in air 7, and FIG. 2B shows the air 7 being expelled from the interior of the microhole 2 and replaced by the vapor 6. FIG. 2C depicts the substrate 1 after it has been immersed in the non-boiling liquid 9, and FIG. 2D shows the vapor 6 completely liquified, with the non-boiling liquid 9 having been introduced to the interior of the microhole 2.

Though there is no particular restriction upon the liquid 5 and non-boiling liquid 9, examples are water and solutions thereof, as well as organic solvents such as alcohol and ether. If the liquid 5 and non-boiling liquid 9 are soluble in each other, they can be the same or different. Water or an aqueous solution with water as the solvent can be used advantageously since it is inexpensive, easy to handle and possessed of a low boiling point. For example, water can be used as the liquid 5 and an aqueous degreasing solution can be used as the non-boiling liquid 9.

In a case where a treatment is applied using a liquid, it is common practice to dip the substrate successively into each of a variety of aqueous solutions. If the liquid can be introduced into the interior of the microhole completely at an initial stage of the treating process, the inner wall surface of the microhole will attain a wet state and the air bubble W will not readily lodge itself in the hole while the treatment is in progress.

Accordingly, the method of the present invention is most effective when employed at an initial stage of a treatment process. However, in a case where it is required that a liquid be introduced into microholes at every step of the process, the method of the invention can be carried out at every step. When such is the case, it is much simpler and convenient in terms of equipment to use the present invention rather than rely upon the conventional method that employs vacuum depressurization.

Though the foregoing embodiment relates to a case where the air in the microhole is replaced inside the vapor, other embodiments are possible.

FIG. 3 is a schematic sectional view of a second embodiment in which portions already described in conjunction with FIG. 1 are designated by like reference characters and need not be described again. In this embodiment, the substrate 1 is immersed in the first tank 3A containing a boiling liquid 5, and the substrate 1 is immersed in the non-boiling liquid 9 contained in the second tank 3B after the boiling liquid 5 has been introduced to the interior of the microhole 2.

Thus, the objective can be attained using either a vapor or a boiling liquid. Furthermore, though there is a portion where the vapor and the boiling liquid mix together locally in the boiling state, the apparatus of the invention is applicable even in such case.

Though the second tank 3B is not provided with cooling means in FIGS. 1 and 3, the non-boiling liquid does experience a temperature rise owing to the particular treatment, and therefore cooling means can be provided if required.

Figure 4:
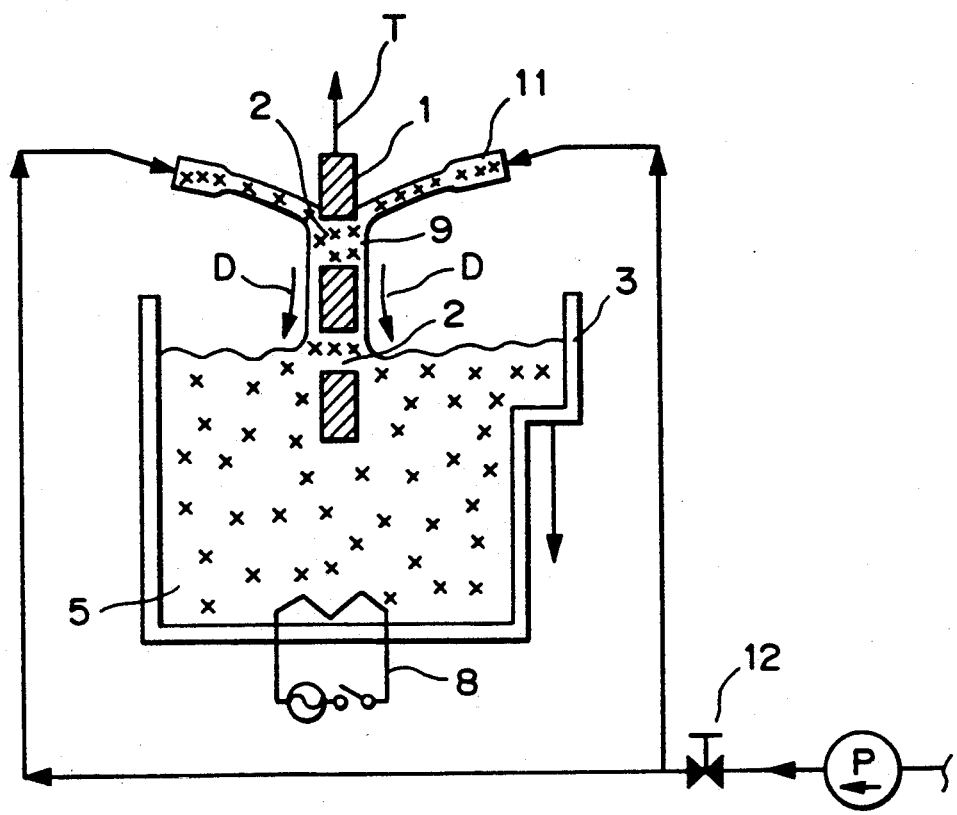
FIG. 4 is a schematic sectional view of a third embodiment.

FIG. 4 is a schematic sectional view of a third embodiment having contacting means. Specifically, immediately before the substrate 1 is raised from the vessel 3, the non-boiling liquid 9 is discharged into the vessel 3 using a discharging mechanism 11 and a switching mechanism 12 so that the liquid 9 will flow down in the direction of arrow D on both surfaces of the substrate 1. Thus, this embodiment prevents the substrate 1 from coming into contact with the outside air.

The switching mechanism 12 can employ an ordinary valve and is capable of being automated electromagnetically, by way of example. In addition, it will suffice to discharge the liquid 9 only during the time that the substrate is being raised, thus making possible treatment using only a small amount of liquid.

Since it is necessary that the liquid flow down over the entire substrate 1, it is required that the discharge mechanism 11 be so adapted that the spreading width of the liquid 9 be greater than the width of the substrate 1. Further, it is required that the discharging mechanism 11 form a liquid curtain which flows down on the entire surface of the substrate without entrapping the outside air. After the foregoing treatment, the substrate 1 is raised in the direction of arrow T.

Figure 5:
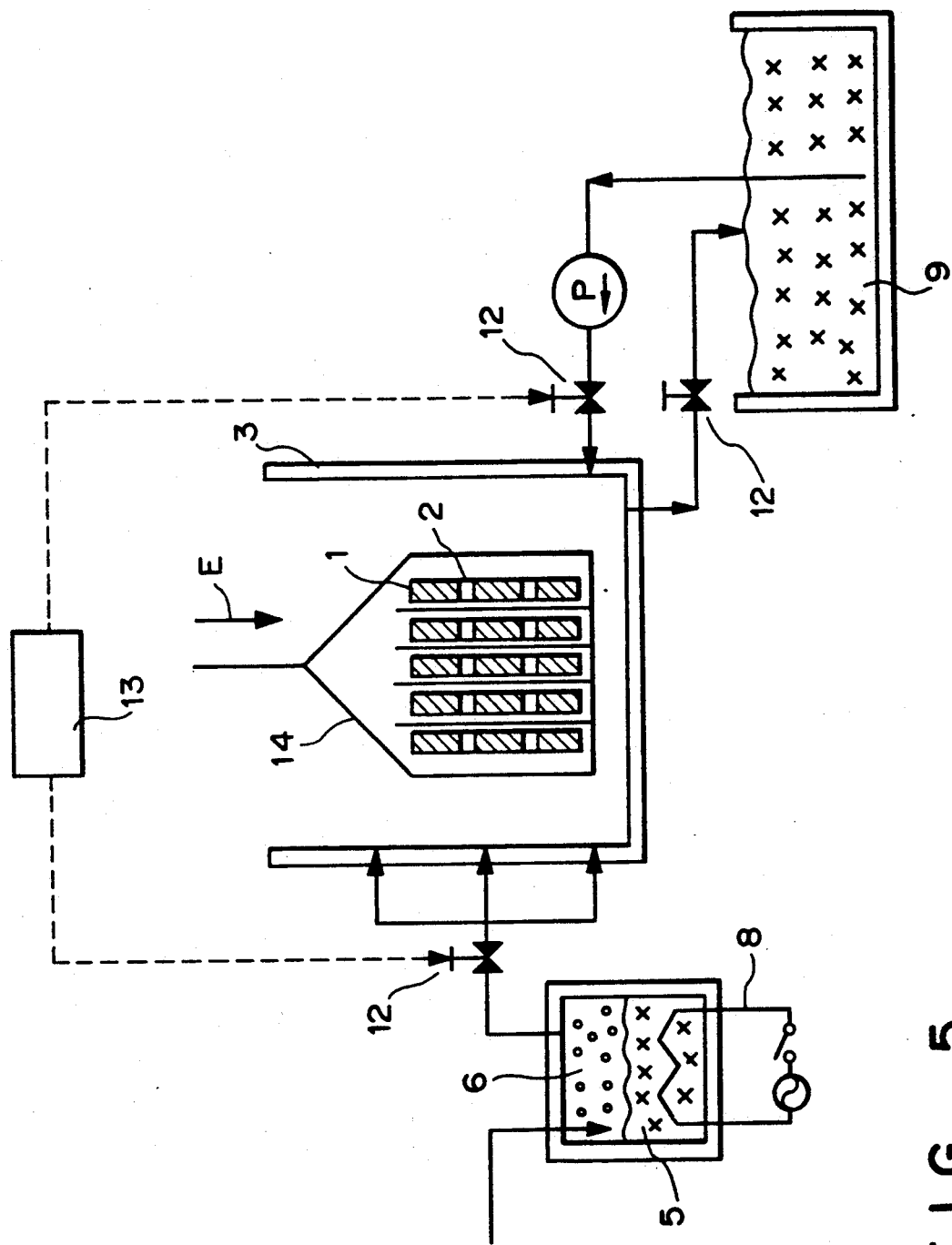
FIG. 5 is a schematic sectional view of a fourth embodiment.

FIG. 5 is a schematic sectional view of a fourth embodiment. In this embodiment, the boiling means is provided exterior to the vessel 3, and the vapor produced by boiling is fed into the vessel 3 via switching means 12 to fill the interior of the vessel, whereby any air in the microhole 2 of the substrate 1 is replaced by the vapor 6. Thereafter, with the vapor 6 still filling the vessel 3, the non-boiling liquid 9 is fed into the vessel 3, whereby contact is made with the non-boiling liquid 9 but not with the outside air.

In order to achieve the foregoing control, the switching means 12, which admits the vapor and the non-boiling liquid in repeated fashion, is connected to control means 13 for executing this control.

Thus, in accordance with the arrangement of this embodiment, a number of substrates 1 can be placed in a jig 14 and treated continuously.

The control means 13 can execute control based upon a signal derived electromagnetically, mechanically or by means of pressure. The switching means employ valves conforming to these various types of control.

In each of the foregoing embodiments, the invention is described only with regard to treatment of a microhole passing completely through a printed circuit board. However, this does not impose a limitation upon the invention, for the invention can be applied also to articles having holes which are not through-holes.

Figure 6:
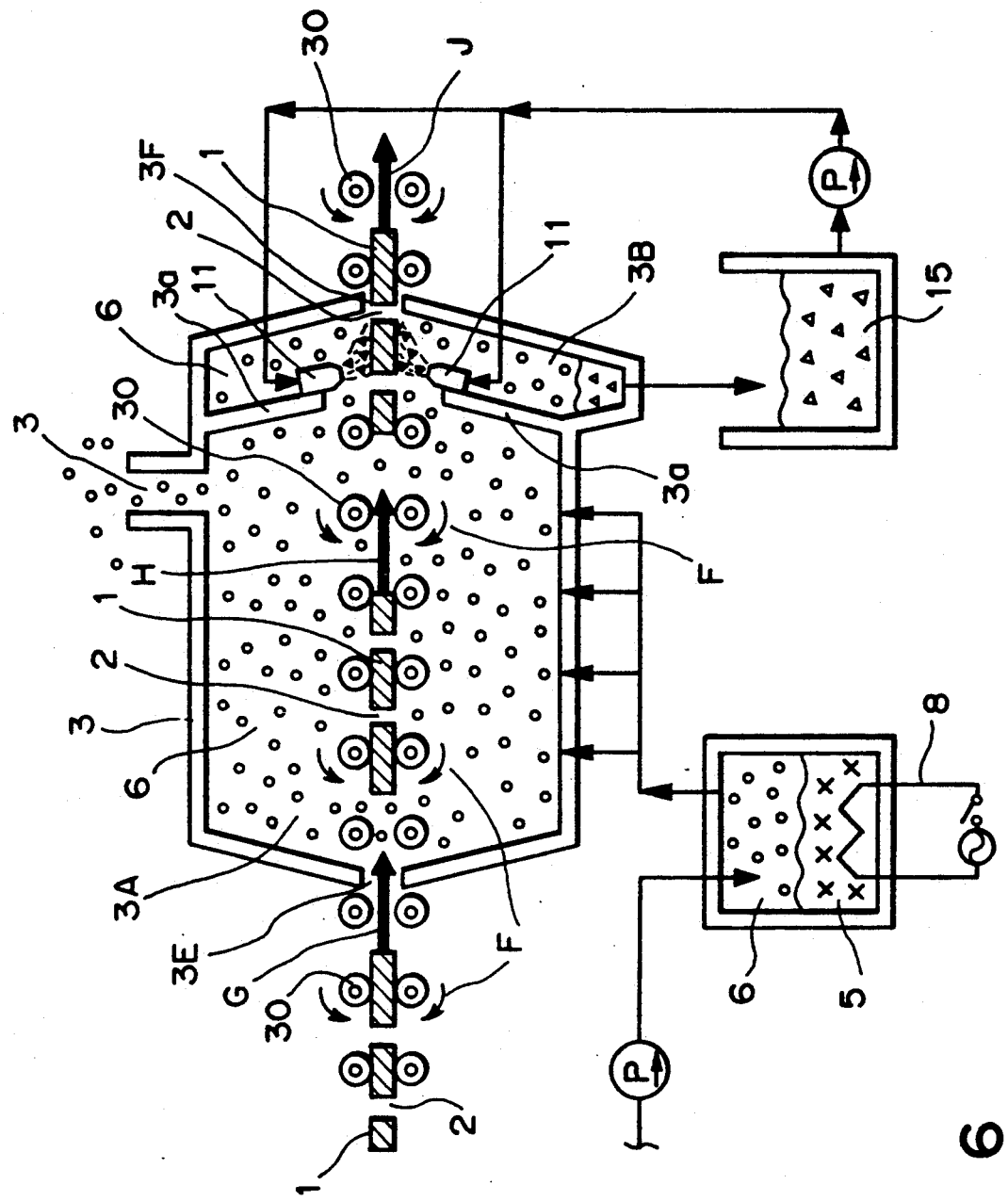
FIG. 6 is a schematic sectional view of a fifth embodiment.

FIG. 6 is a schematic sectional view showing a fifth embodiment, in which substrates 1 are conveyed automatically. In FIG. 6, portions already described above are designated by like reference characters and need not be described again; only portions that are different will be described. In this embodiment, as shown in FIG. 6, the vessel 3 is transversely elongated and is provided with a left opening 3E, the aforementioned partition 3a, and a right opening 3F. The vessel 3 is further provided with a plurality of opposing conveying rollers 30 for conveying the substrates 1 in the direction of arrow H to transport them out of the vessel from the right opening 3F. These same rollers 30 feed in the substrates 1 from the left through the left opening in the direction of arrow G.

The vessel 3 is provided with a device for feeding the aforementioned vapor 6 into the vessel to fill it with the vapor, whereby the air inside the microhole 2 of substrate 1 is replaced. Further, the side of the vessel to the right of the partition 3a is provided with a set of nozzles 11 serving as contacting means for achieving contact with a treating liquid 15, without making contact with the outside air, while the vapor 6 produced by boiling continues to fill the interior of the vessel 3.

In the arrangement of the above embodiment, the substrates 1 are continuously supplied in the directions of arrows G, H and J by the conveying rollers 30. As a result, the microholes 2 can be treated continuously without hindrance.

Figure 7:
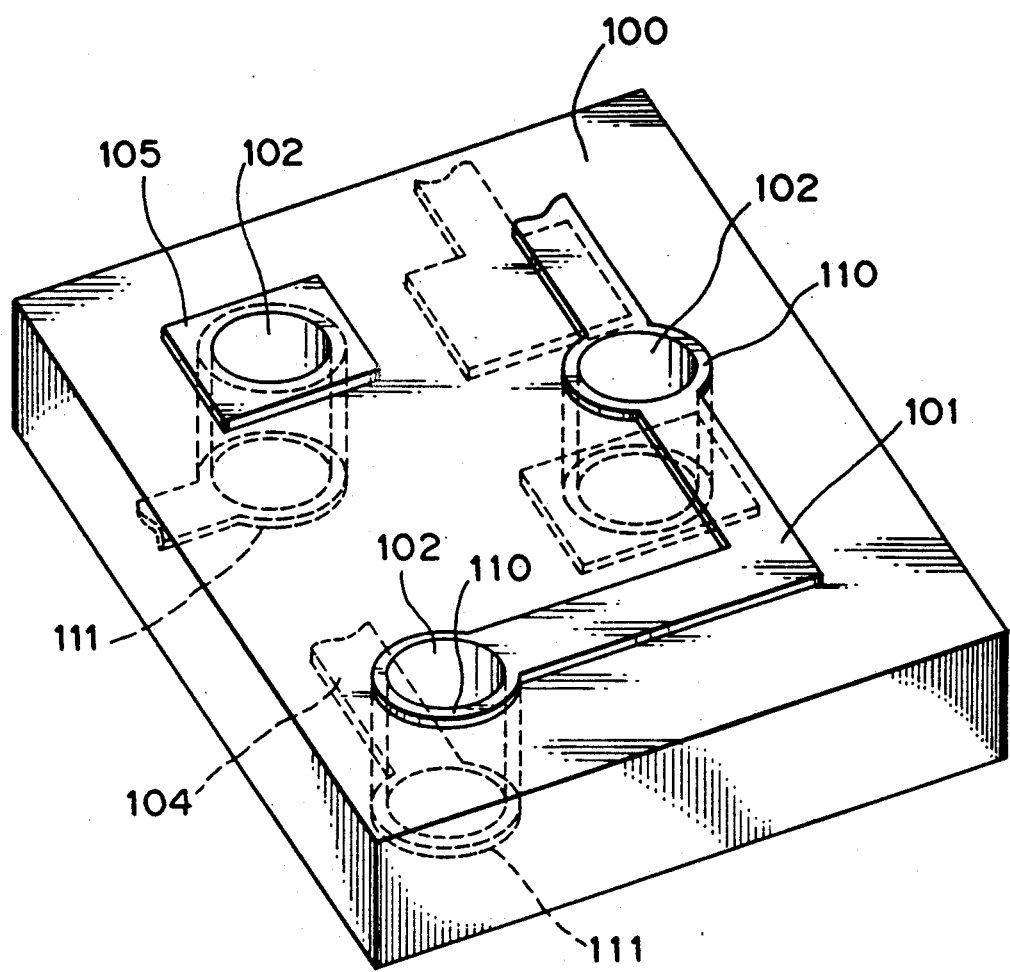
FIG. 7 is a perspective view of an electronic circuit board.
Figure 8A:
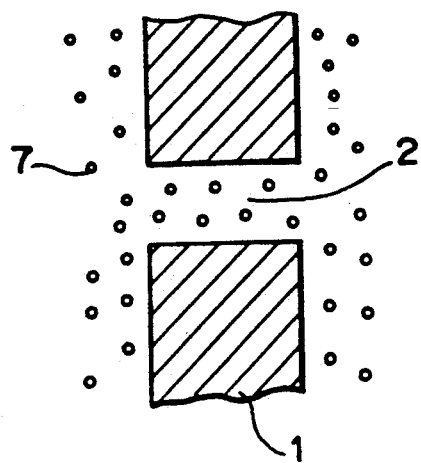
FIGS. 8A and 8B are schematic sectional views for describing the principle of the prior art.
Figure 8B:
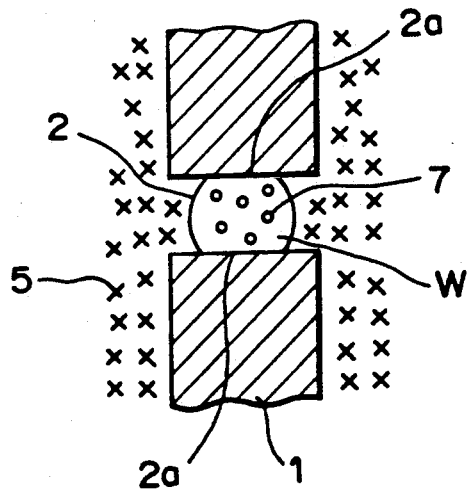

FIG. 7 is an external perspective view showing a printed circuit board 100 pre-treated by the liquid introducing apparatus described above. As shown in FIG. 7, the printed circuit board 100 has a through-hole 102 having an inner wall portion. Lands 105, 110, 111 for surface parts are formed around both openings of the through-hole 102 at the location of the inner wall portion, and a copper plating portion which connects the front and back sides of the circuit board 100 is formed uniformly on the inner wall portion. Thus, the lands 10, 111 on the front and backsides are brought into electrical communication.

A pattern 101 is formed on the front side of the circuit board 100 to interconnect the lands 110, and a pattern 104 is formed on the back side of the circuit board 100 to interconnect the lands 111. The printed circuit board 100 can be obtained by providing holes having diameters of 0.3 mm and 0.1 mm in the same substrate.

In the foregoing embodiment, all of the microholes 2 are through-holes. However, it goes without saying that the invention can be applied similarly also in cases where the holes are not through-holes. The invention is applicable to various precision parts having microholes. In addition, the invention can be used in a treatment for washing an ink-jet printer having microholes as small as 30 microns in diameter. The field of application is not limited to electronic circuit boards.

Furthermore, the microholes need not be circular but can be elliptical or rectangular, and the microholes can be gaps rather than actual holes. Moreover, conventional methods can be used conjointly with the method and apparatus of the invention. In other words, attaching the above-mentioned vibratory degassing apparatus, the air in the microholes can be replaced more rapidly. If the method of the invention is used along with the vacuum depression method, the boiling point of the liquid can be reduced by decompression, so that water can be made to boil at a temperature of less than 100° C., by way of example. Accordingly, the invention can be applied to an aqueous solution the liquid temperature of which cannot be raised to 100° C.

Specific experimental results using the above-described method of the present invention will now be set forth.

In Experiment 1, a number of holes having a diameter of 0.1 mm were drilled in a glass epoxy copper fulling board (TLC-W-551, manufactured by Toshiba Chemical) having a thickness of 0.6 mm. This board was used as the substrate 1.

Tap water was introduced to the first tank 3A on the left side of the vessel 3 shown in FIG. 1B, and the tap water was boiled by the heater 8. A degreasing solution (Paknar, 30 g/l, manufactured by Yuken Kogyo) was introduced to the second tank 3B on the right side of the vessel 3, and the solution temperature was adjusted to 80° C. The substrate 1 was suspended in the vapor (steam) produced by boiling in the first tank 3A of vessel 3, the substrate was left standing in the vapor for 10 minutes, and it was then transferred to the degreasing solution 9 without being extracted from the vessel 3. The substrate 1 was immersed in the degreasing solution for 10 minutes. The substrate 1 was then extracted from the vessel 1 and subjected to a prescribed pretreatment and electroless copper plating, after which a copper plating film was formed to a maximum thickness of 20 µm on the interior of the microhole 2 by electroplating. Next, the substrate 1 was cut into chips each having one microhole, and the conductor resistance of the microhole was measured.

A control sample for the purpose of comparison with Experiment 1 was obtained as a control substrate 1 in the same manner as in Experiment 1. This substrate was placed inside an empty beaker which was then evacuated for 10 minutes by an aspirator using a bell-jar to establish a reduced pressure of 520 mmHg. Next, tap water was introduced to the interior of the beaker while maintaining the decompressed state. The substrate was extracted and immersed in the aforementioned 80° C. degreasing solution in the same manner as Experiment 1. This was followed by treatment and measurement as in Experiment 1.

In Experiment 2, a substrate 1 similar to that of Experiment 1 was prepared, tap water was introduced to the first tank 3A of vessel 3 shown in FIG. 3, the tap water was held in a boiling state, and the second tank 3B was filled with the aforementioned 80° C. degreasing solution. The substrate 1 was immersed for 10 minutes in the vapor (steam) produced by boiling and was then transferred to the degreasing solution without taking it out of the vessel. The substrate was immersed in the degreasing solution for 10 minutes. Following extraction, the substrate was treated in the same manner as in Experiment 1.

In Experiment 3, a beaker was filled with the above-mentioned degreasing solution, which was maintained at a temperature of 80° C. A substrate similar to that of Experiment 1 was immersed within the beaker and pressure was reduced as in the control experiment described above. The degreasing solution was brought to boil at 350 mmHg and was kept boiling for five minutes, after which atmospheric pressure was restored and the substrate extracted. The substrate was then treated as in Experiment 1.

As a result of measuring the conductor resistance of the microholes 2 in the foregoing experiments and control experiment, it was found that the failure rate produced by defective articles was 0% in all of the experiments and 4% in the control experiment only. The number of chips measured was 100, and the failure rate was calculated using a resistance in excess of 50 mΩ as the criterion for failure.

In accordance with the foregoing results, a sufficient vacuum cannot be obtained in ten minutes using the conventional decompression method, as in the control experiment described above. This accounted for the failure rate of 4%. By contrast, the failure rate was 0% in Experiments 1 through 3 according to the present invention. This demonstrates that all of the methods and apparatus according to the invention are excellent.

In accordance with the present invention as described above, the following advantages are obtained;

1) It is possible to introduce a liquid to the interior of a microhole in a short period of time. This provides greater efficiency than the conventional vacuum decompression method.

2) Since satisfactory effects are obtained with simple equipment, the cost of equipment can be reduced. This affords greater economy.

3) The method of the invention can be used in combination with conventional methods and therefore has a wide range of application.

What is claimed is:

1. A method of introducing a liquid into a small-diameter hole of a substrate, comprising the steps of:
   placing the substrate into a container of boiling vapor and/or boiling solution;
   pouring a non-boiling liquid forming a liquid curtain into the container; and
   raising the substrate from the container through the liquid curtain so the entire surface of the substrate is washed with the non-boiling liquid before the substrate is exposed to external air.

2. A method according to claim 1, further comprising the steps of:
   placing the substrate into a container comprising a tank in which the boiling vapor and/or boiling solution and the non-boiling liquid are introduced;
   starting to pour the non-boiling liquid before the substrate is raised from the tank; 'stopping the pouring of the non-boiling liquid after raising the substrate is completed; and
   forming the liquid curtain of a width greater than the width of the substrate so the curtain flows downward over the entire surface of the substrate without the substrate being exposed to the external air.

3. A method according to claim 1, further comprising the steps of:
   placing the substrate into a container comprising a tank in which the boiling vapor and/or boiling solution and the non-boiling liquid are introduced;
   introducing the boiling vapor and/or boiling solution into the container via a first switch;
   introducing the non-boiling liquid into the container via a second switch; and
   opening the first switch to subject the substrate to a boiling treatment, opening the second switch while keeping the first switch open after the substrate has been treated, and closing the first and second switch when the substrate has been submerged in the non-boiling liquid which is formed as the liquid curtain.

4. The method according to claim 1, 2 or 3, wherein the boiling solution is steam, or the boiling solution and the non-boiling liquid are water or solutions of alcohols which have water as a solvent.

5. The method according to claims 1, 2 and 3, wherein the substrate is an electronic circuit board having a through-hole.

* * * * *

UNITED STATES PATENT AND TRADEMARK OFFICE
CERTIFICATE OF CORRECTION

PATENT NO. : 5,215,593
DATED : June 1, 1993
INVENTOR(S) : Shigenobu Nojo, et al.

It is certified that error appears in the above-identified patent and that said Letters Patent is hereby corrected as shown below:

ON THE TITLE PAGE:

[56] REFERENCES CITED:

U.S. PATENT DOCUMENTS, "Takeda et al." should read --Takada et al.--.

[57] ABSTRACT:

Line 14, "small-diameter." should read --small-diameter hole--.

COLUMN 6:

Line 36, "lands 10," should read --lands 110,--.

COLUMN 8:

Line 38, "'stopping" should read --¶ stopping--.
Line 62, "or" should read --and--.
Line 65, "and" should read --or--.

Signed and Sealed this

Fifth Day of April, 1994

Attest:

BRUCE LEHMAN

*Attesting Officer*    *Commissioner of Patents and Trademarks*